(12) United States Patent
Kakinuma et al.

(10) Patent No.: US 6,342,322 B1
(45) Date of Patent: Jan. 29, 2002

(54) PHOTOSENSITIVE COMPOSITION AND CALCINED PATTERN OBTAINED BY USE THEREOF

(75) Inventors: Masahisa Kakinuma, Saitama-ken; Hideaki Kojima; Nobuyuki Yanagida, both of Kawagoe, all of (JP)

(73) Assignee: Taiyo Ink Manufacturing Co., Ltd. (JP)

( * ) Notice: Subject to any disclaimer, the term of this patent is extended or adjusted under 35 U.S.C. 154(b) by 0 days.

(21) Appl. No.: 09/257,000

(22) Filed: Feb. 25, 1999

(30) Foreign Application Priority Data

Mar. 2, 1998 (JP) ............................. 10-063902

(51) Int. Cl.$^7$ ................................. G03C 3/00
(52) U.S. Cl. ................... 430/17; 430/285.1; 430/9; 430/18; 430/330; 522/83; 522/149
(58) Field of Search ............... 430/285.1, 9, 17, 430/18, 330, 198; 522/83, 149

(56) References Cited

U.S. PATENT DOCUMENTS

| | | | |
|---|---|---|---|
| 5,209,688 A | | 5/1993 | Nishigaki et al. ............ 445/24 |
| 5,753,722 A | * | 5/1998 | Itokawa et al. ............... 522/83 |
| 5,851,732 A | | 12/1998 | Kanda et al. ............... 430/321 |
| 5,858,616 A | | 1/1999 | Tanaka et al. ............ 430/281.1 |
| 5,972,564 A | * | 10/1999 | Kawana et al. .......... 430/281.1 |
| 6,001,533 A | * | 12/1999 | Sega et al. ............... 430/270.1 |

FOREIGN PATENT DOCUMENTS

| | | |
|---|---|---|
| JP | 5-67405 | 3/1993 |
| JP | 5-271576 | 10/1993 |

OTHER PUBLICATIONS

Registry No. 142497–32–3, Cyclomer M 101 ACS, 2001 one page from STN online Registry file.*
Registry No. 82428–30–6, Cyclomer M 100, ACS 2001, one page from STN online Registry file.*

* cited by examiner

Primary Examiner—Cynthia Hamilton
(74) Attorney, Agent, or Firm—Rader, Fishman & Grauer PLLC

(57) ABSTRACT

Disclosed are a photosensitive composition which is developable with an aqueous alkaline solution and such calcined patterns as a conductor pattern, a vitreous dielectric pattern, and a fluorescent pattern which are obtained by the use of the photosensitive composition. The photosensitive composition comprises (A) a carboxyl group-containing photosensitive polymer obtained by the reaction of a copolymer of (a) a compound containing an unsaturated double bond and a carboxyl group and (b) an unsaturated double bond-containing compound with (c) a compound containing an unsaturated double bond and an epoxy group, (B) a diluent, (C) a photopolymerization initiator, (D) an inorganic powder, and (E) a stabilizer. The composition may be in the form of paste or in the form of a dry film. When the photosensitive composition is in the form of paste, the paste is applied to a substrate and then dried to form a film. When the photosensitive composition is in the form of a dry film, the film is laminated on the substrate. A calcined pattern of high fineness is obtained by patterning the superposed layer of the composition by selective exposure to light and development, and thereafter calcining the patterned film.

16 Claims, 2 Drawing Sheets

PHOTOSENSITIVE COMPOSITION AND CALCINED PATTERN OBTAINED BY USE THEREOF

BACKGROUND OF THE INVENTION

1. Field of the Invention

This invention relates to a photosensitive composition which is developable with an aqueous alkaline solution and is applicable particularly advantageously to the formation of a conductor circuit pattern, a barrier rib pattern, a dielectric pattern, a fluorescent pattern, and a black matrix on the front and the back substrate of a plasma display panel, and applicable also to the formation of an electric conductor, a resister, and a dielectric element for use in a fluorescent display tube and electronic parts. This invention also relates to such calcined patterns as a conductor pattern, a vitreous dielectric pattern, and a fluorescent pattern which are obtained by the use of the photosensitive composition.

2. Description of the Prior Art

A plasma display panel (hereinafter abbreviated as "PDP") is a planar display for exhibiting pictures and pieces of information by utilizing the light emitted by plasma discharge. It is classified under the DC type and the AC type according to the structure of panel and the mode of driving. The principle of color display by the PDP consists in generating plasma discharge in cells (discharge spaces) between two opposed electrodes severally formed on a front glass substrate and a back glass substrate separated by intervening ribs (barriers), and exciting the phosphor formed on the inner surface of the back glass substrate with the ultraviolet light generated by the discharge of such a gas as He or Xe sealed in the cells thereby inducing generation of visible lights of three primary colors. The cells in the DC type PDP are divided by the component ribs of a lattice, whereas those in the AC type PDP are divided by the ribs which are parallelly arranged on the face of the substrate. In either case, the cells are divided by ribs.

FIG. 1 illustrates a typical construction of the planar discharge type PDP using a three-electrode structure for full color display. On the lower face of a front glass substrate 1, many pairs of display electrodes 2a, 2b each comprising a transparent electrode 3a or 3b intended for discharge and a bus electrode 4a or 4b intended for lowering the line resistance of the transparent electrode are formed. On the display electrodes 2a, 2b, a transparent dielectric layer 5 (low melting glass) for accumulating electric charge is formed by printing and calcination. A protective layer (MgO) 6 is formed thereon by vacuum deposition. The protective layer 6 assumes the role of protecting the display electrodes and maintaining the state of discharge.

On a back glass substrate 7, ribs (barriers) 8 shaped like stripes and adapted to partition discharge spaces and address electrodes (data electrodes) 9 severally disposed in the discharge spaces are formed with prescribed pitches. On the inner faces of discharge spaces, fluorescent films of the three colors, i.e. red (10a), green (10b), and blue (10c), are laid out regularly. In the full color display, the fluorescent films of the three primary colors of red, green, and blue mentioned above jointly form one picture element.

The PDP described above is called a "planar discharge system" because an AC pulse voltage is applied between the pair of display electrodes 2a, 2b to induce discharge between the electrodes on one and the same substrate. It has a construction such that the ultraviolet light generated by discharge excites the fluorescent films 10a, 10b, and 10c of the back substrate 7 and the visible light consequently generated is seen through the transparent electrodes 3a, 3b of the front substrate 1 (reflection type).

Heretofore, the conductor patterns and the dielectric patterns on plasma display panels, fluorescent display tubes, and electronic parts have been formed by the screen printing method using a conductive paste or a glass paste which generally contains a very large amount of metallic powder or glass powder.

In recent years, however, the electronic parts have come to require the patterns formed thereon to have improved fineness. The formation of patterns by the conventional screen printing method has come to answer the demand for higher pattern fineness only with difficulty because it entails such problems as requiring skill on the part of workers, producing such blemishes as blurs or blots during the course of printing, and entailing deterioration of accuracy of registeration of images due to elongation and contraction of the screen.

The photosensitive paste which contains a copolymer easily depolymerizable with heat in combination with an inorganic powder has come to find adoption as a means to fulfill the demand for improved pattern fineness. This photosensitive paste in most cases incorporates no photoreactive group in the base resin thereof and, therefore, is at a disadvantage in allowing photo-curing to proceed only to an insufficient depth during the course of exposure to light, producing inferior resolution after the development, and suffering the applied layer of paste to betray deficiency in fastness of adhesion to a substrate and in calcining properties. An effort to increase the depth of photo-curing and allow formation of patterns of improved fineness requires the photosensitive paste to incorporate additionally therein a reactive diluent (photopolymerizable monomer) in a large amount, with the awkward result that the proportion of the unsaturated group of the reactive diluent which remains in an unaltered form during the course of exposure to light will increase, the unaltered portion of the reactive diluent will be gelated during the course of calcining and consequently suffered to give rise to a calcining residue, and the gelation will entail shrinkage and consequently compel the pattern to sustain distortion and contraction of line width and, in the worst case, result in breakage of the lines.

On the other hand, as a photosensitive, electroconductive paste which is intended for forming a conductor pattern on a ceramic circuit board, a paste composition containing an electroconductive powder, an acrylic copolymer possessing carboxyl groups and ethylenically unsaturated groups in the side chains thereof (for example, a polymer having glycidyl acrylates attached by addition reaction to a copolymer of methacrylic acid with methyl methacrylate and styrene), a photoreactive compound, and a photopolymerization initiator is disclosed in published Japanese Patent Application, KOKAI (Early Publication) No. (hereinafter referred to briefly as "JP-A-") 5-67,405 and JP-A-5-271,576, for example.

The patent publications mentioned above teach that the photosensitive, electroconductive paste of the kind described above, when applied in a layer on a substrate and then subjected to exposure to light and development, is enabled to form a conductor circuit pattern and that the pattern nevertheless is fated to be calcined at a temperature in the range of 600° to 1,000° C. This photosensitive, electroconductive paste, therefore, is unfit for use in the PDP because it gives rise to a calcining residue at a temperature of not more than 600° C. i.e. the calcining temperature which is used during the manufacture of PDP (since soda glass is generally used for the substrate of the PDP, the calcining must proceed at a temperature of not more than 600° C.) and consequently induce deterioration of the electro-conductivity of the electrode circuits to be formed.

An attempt at simultaneous incorporation of low melting glass frit in the composition under discussion for the purpose of enabling the calcining to proceed at a relatively low temperature derives from the strong acidity of the methacrylic acid as a component of the copolymeric resin such problems as deteriorating the stability of storage of the produced composition, impairing the operational efficiency of coating work owing to gelation and degradation of flowing property, and disabling stable development with an aqueous alkaline solution.

SUMMARY OF THE INVENTION

The present invention, conceived in the light of the problems of the prior art mentioned above, has for the primary object thereof the provision of a photosensitive composition which excels in photo-curing properties and exhibits a prominent photo-curing depth even when the composition contains an inorganic fine powder in a very large amount.

A further object of the present invention is to provide a photosensitive composition which exhibits satisfactory stability of storage and excels in developability with an aqueous alkaline solution, fastness of adhesion to a substrate, and calcining properties.

A more concrete object of the present invention is to provide a photosensitive composition which is developable with an aqueous alkaline solution, permits formation of a conductor circuit pattern, a vitreous dielectric pattern, or a fluorescent pattern of high fineness with satisfactory workability and high productivity by the photolithographic technique, and undergoes a calcining step at a temperature of not more than 600° C. infallibly without giving rise to a calcining residue capable of exerting an adverse effect on an image.

Another object of the present invention is to provide a calcined pattern of high fineness manufactured with high productivity from the photosensitive composition mentioned above through a series of selective exposure to light, development, and calcining and a technique for the manufacture.

To accomplish the objects mentioned above, the first aspect of the present invention resides in providing a photosensitive composition characterized by containing (A) a carboxyl group-containing photosensitive polymer obtained by the reaction of a copolymer of (a) a compound containing an unsaturated double bond and a carboxyl group and (b) an unsaturated double bond-containing compound with (c) a compound containing an unsaturated double bond and an epoxy group, (B) a diluent, (C) a photopolymerization initiator, (D) an inorganic powder, and (E) a stabilizing agent.

The photosensitive composition of the present invention may be in the form of paste or in the form of a dry film produced in advance from the composition in the form a film.

In the case of the pasty form, a photosensitive and electroconductive past composition is produced by chiefly using a fine metallic powder as the inorganic powder (D) and a photosensitive glass paste composition is produced by exclusively using glass powder. The paste composition for use in the black matrix additionally contains a black pigment.

Another aspect of the present invention resides in providing a calcined pattern formed of the photosensitive composition described above. When the photosensitive composition is in the form of paste, for example, the pasty photosensitive composition is applied to a substrate and then dried to form a film. When the photosensitive composition is in the form of a dry film, the dry film is laminated on the substrate. A calcined pattern of high fineness is obtained by patterning the superposed layer of the composition by selective exposure to light and development, and thereafter calcining the patterned film.

The calcined pattern which is formed as described above serves as a conductor pattern when a fine metallic powder is used as the inorganic powder (D) mentioned above or a vitreous dielectric pattern when a glass powder is used instead. Optionally, a fluorescent pattern may be formed by using a fluorescent powder as the inorganic powder.

BRIEF DESCRIPTION OF THE DRAWINGS

Other objects, features, and advantages of the invention will become apparent from the following description taken together with the drawings, in which.

DETAILED DESCRIPTION OF THE INVENTION

Figure 1:
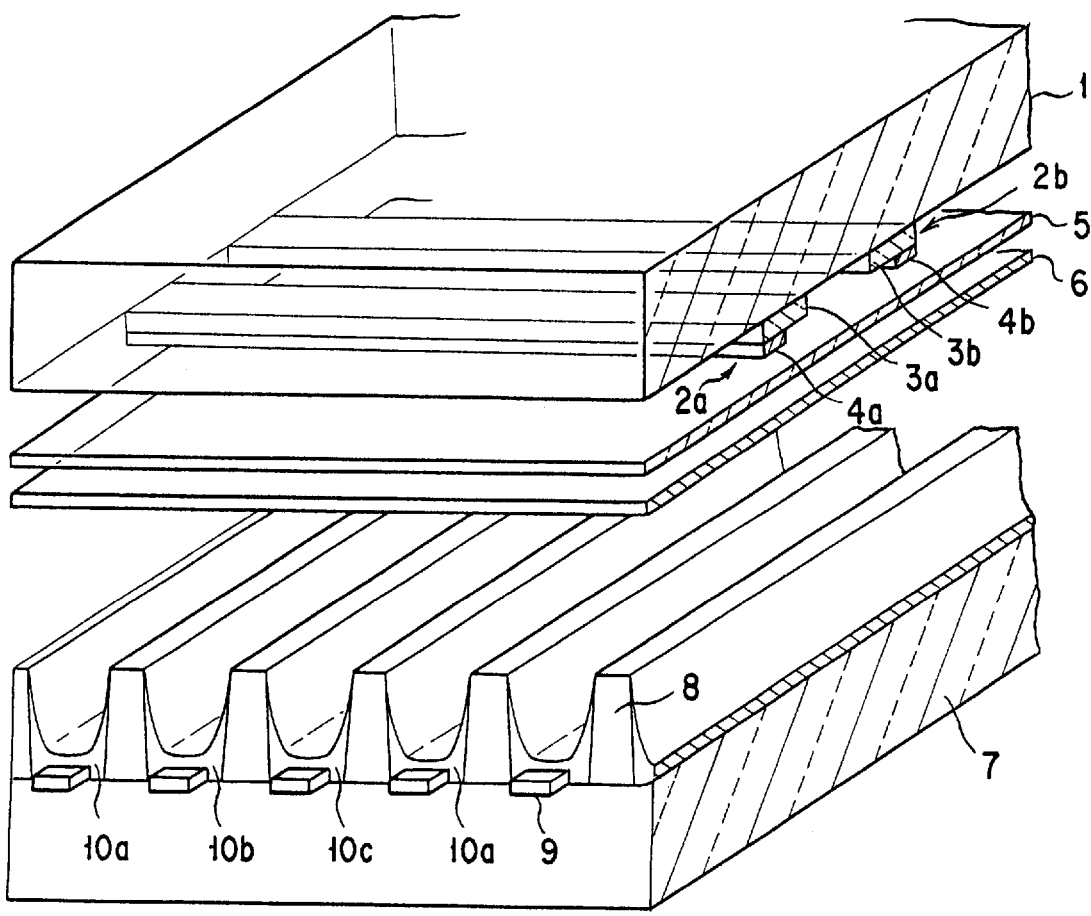
FIG. 1 is a fragmentary exploded perspective view of the AC type PDP of the planar discharge system.

When the calcined pattern is formed by using the conventional photosensitive paste composition, it allows photo-curing to proceed only to an insufficient depth during the course of exposure to light and consequently entails such problems as producing inferior resolution after the development and suffering the pattern to sustain distortion and contraction of line width during the course of calcining, as discussed above. The present inventors, after pursuing a diligent study on this phenomenon, have discovered that the major cause for this phenomenon resides in the fact that the photosensitive paste composition used for the formation of a conductor pattern or a dielectric pattern contains such an inorganic powder as a fine metallic powder having an extremely small particle diameter in a very large amount and, therefore, tends to offer no high permeability to light during the course of exposure to light and prevent photo-curing from advancing sufficiently and impair the evenness of the advance of photo-curing. This phenomenon gains in conspicuity in proportion as the thickness of the film increases and the depth in the film grows.

The first characteristic feature of the photosensitive composition of the present invention, therefore, resides in the use of a specific photosensitive resin which is obtained by adding as a pendant a group containing an α,β-ethylenically unsaturated double bond to the binder resin itself for the inorganic powder. Specifically, the carboxyl group-containing photosensitive polymer (A) to be used in the present invention is characterized by causing part of the carboxyl groups of the copolymer of the compound (a) containing an unsaturated double bond and a carboxyl group and the unsaturated double bond-containing compound (b) to react with the epoxy group of the compound (c) containing an unsaturated double bond and an epoxy group at such a ratio as to improve the photo-curing properties until a sufficient photo-curing depth is obtained thereby inducing introduction of the unsaturated double bond of the compound (c) into the side chain of the copolymer. Since the copolymer keeps part of the carboxyl groups contained in the compound (a) which is one of the monomer components of the aforementioned copolymer in the unreacted form, the carboxyl group-containing photosensitive polymer (A) to be obtained continues to be soluble in an aqueous alkaline solution. The film which is formed of the photosensitive composition of the present invention, therefore, permits stable development with an aqueous alkaline solution after the selective exposure to light.

When the photosensitive composition of the present invention is intended to form glass paste, a low melting glass powder is used as the inorganic powder (D). Even when such other inorganic powder as metal powder is used for forming electro-conductive paste, the incorporation of the low melting glass powder in a small amount proves advantageous. The presence of the low melting glass powder enables the composition to be calcined at a temperature of not more than 600° C. and enhances the fastness of adhesion of the calcined pattern to the substrate. The composition having incorporated therein the metal powder and the glass powder, however, entails such problems as tending to suffer degradation of stability of storage and impairment of the operational efficiency of coating work owing to the gelation or the decline of flowability of the composition. The second characteristic feature of the photosensitive composition of the present invention is to incorporate therein a stabilizer (E), in conjunction with the aforementioned carboxylic group-containing photosensitive polymer (A), a diluent (B), a photopolymerization initiator (C), and an inorganic powder (D).

As a result, the photosensitive composition of the present invention permits a pattern of high fineness to be easily formed on a substrate of a large surface area by the photolithographic technique without entailing such problems as suffering degradation of stability of storage and impairment of the operational efficiency of coating work owing to the gelation or the decline of flowability of the composition, fully allows the calcining step performed at a temperature of not more than 600° C., and realizes a marked improvement of the yield.

Now, the components of the photosensitive composition of the present invention will be described in detail below.

The carboxyl group-containing photosensitive polymer (A) to be used in the present invention is a resin which is obtained by causing the epoxy group of the compound (c) having an unsaturated double bond and an epoxy group in its molecule to react with part of the carboxyl groups of the copolymer of (a) the compound having an unsaturated double bond and a carboxyl group in its molecule, i.e. unsaturated carboxylic acid, and (b) the compound having an unsaturated double bond in its molecule.

The carboxyl group-containing photosensitive polymer (A) described above may be incorporated in the composition in an amount of 5 to 30% by weight based on the total amount of the composition. If the amount of the photosensitive polymer to be incorporated is unduly smaller than the lower limit of the range mentioned above, the uniformity of the distribution of the photosensitive polymer in the film to be formed will be easily impaired, no sufficient photo-curing properties or photo-curing depth will be easily obtained, and the patterning by selective exposure to light and development will be attained only with difficulty. Conversely, if the amount is unduly larger than the upper limit of the range mentioned above, such defects as distortion of pattern and contraction of line width will arise during the course of calcining.

The carboxyl group-containing photosensitive polymer (A) mentioned above can be used advantageously when the weight-average molecular weight thereof falls in the range of 500 to 50,000 and the acid value thereof falls in the range of 20 to 150 mg KOH/g, preferably 40 to 120 mg KOH/g. If the molecular weight of the carboxyl group-containing photosensitive polymer (A) is less than 500, the polymer will bring an adverse effect on the fastness of adhesion of the film during the course of development. Conversely, if the molecular weight exceeds 50,000, the polymer will tend to impair the operation of development. If the acid value of the polymer is less than 20 mg KOH/g, the solubility of the polymer in an aqueous alkaline solution will be insufficient and the development will tend to prove defective. Conversely, if the acid value exceeds 150 mg KOH/g, the fastness of adhesion of the film will be degraded and the photo-cured part (exposed part) will tend to produce dissolution during the course of development.

As concrete examples of the unsaturated carboxylic acid (a) mentioned above, acrylic acid, methacrylic acid, itaconic acid, crotonic acid, maleic acid, fumaric acid, vinylacetic acid, or anhydrides of these acids; and the reaction product of such an acid hydride as maleic anhydride, itaconic anhydride, or pyromellitic anhydride with such a hydroxyl group-containing unsaturated compound as 2-hydroxyethyl (meth)acrylate, 2-hydroxypropyl (meth)acrylate, and other similar hydroxyalkyl (meth)acrylates may be cited. These unsaturated carboxylic acid may be used either singly or in the form of a mixture of two or more members. The term "(meth)acrylate" as used in the present specification refers collectively to acrylate and methacrylate.

As concrete examples of the aforementioned unsaturated double bond-containing compound (b), styrene, chlorostyrene, and α-methylstyrene; (meth)acrylates possessing methyl, ethyl, propyl, isopropyl, n-butyl, isobutyl, t-butyl, amyl, 2-ethylhexyl, octyl, capryl, nonyl, dodecyl, hexadecyl, octadecyl, cyclohexyl, isobornyl, methoxyethyl, butoxyethyl, 2-hydroxyethyl, 2-hydroxypropyl, and 3-chloro-2-hydroxypropyl as substituent(s); mono(meth) acrylates of polyethylene glycol and mono(meth)acrylates of polypropylene glycol; vinyl acetate, vinyl butyrate, and vinyl benzoate; and acrylamide, methacrylamide, N-hydroxymethyl acrylamide, N-hydroxymethyl methacrylamide, N-methoxymethyl acrylamide, N-ethoxymethyl acrylamide, N-butoxymethyl acrylamide, acrylonitrile, and isobutylene may be cited. These compounds may be used either singly or in the form of a mixture of two or more members. Among other compounds mentioned above, styrene, α-methylstyrene, lower alkyl (meth) acrylates, and isobutylene are advantageously used.

As concrete examples of the compound (c) containing an unsaturated double bond and an epoxy group, at least one of the compounds represented by the following formulas (1) to (4) may be advantageously used. Esterification products of unsaturated carboxylic acids with epichlorohydrin and unsaturated double bond-containing monoepoxy monomers and/or oligomers obtained by the reaction of an unsaturated carboxylic acid with a compound containing polyvalent epoxy groups may also be used.

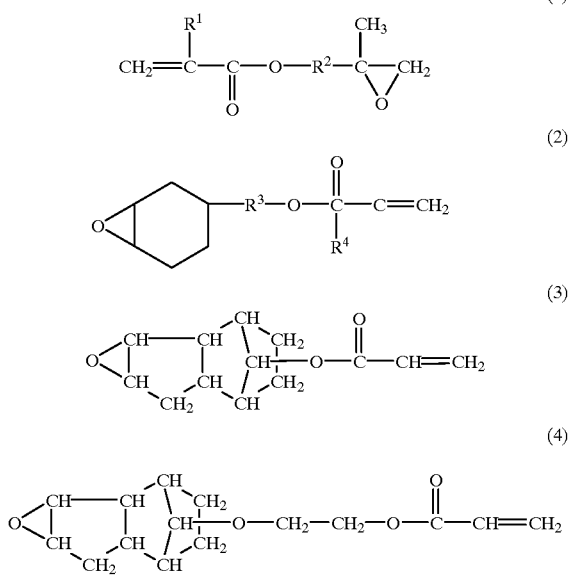

wherein, $R^1$ and $R^4$ independently represent a hydrogen atom or a methyl group, $R^2$ represents an aliphatic hydrocarbon of 1 to 12 carbon atoms, and $R^3$ represents

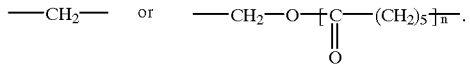

The aforementioned carboxyl group-containing photosensitive polymer (A) obtained by the reaction of the copolymer of the unsaturated carboxylic acid (a) and the unsaturated double bond-containing compound (b) with the compound (C) containing an unsaturated double bond and a methyl group-containing epoxy group, i.e. the compound represented by the formula (1), or an epoxy group having an alicyclic structure, i.e. the compound represented by the formula (2), (3), or (4) is readily depolymerized during the course of calcining and thus the composition containing this polymer permits a calcined pattern to be easily formed with less calcining residue.

The copolymerization reaction of the aforementioned unsaturated carboxylic acid (a) with the unsaturated double bond-containing compound (b) proceeds easily in the presence of a radical polymerization catalyst such as, for example, azobisisobutyronitrile and organic peroxides. It can be carried out by the standard method of solution polymerization at a temperature in the approximate range of 40° to 130° C., thereby giving rise to a random copolymer.

The addition reaction of the compound (c) containing an unsaturated double bond and an epoxy group mentioned above to the carboxyl group in the side chain of the copolymer obtained as described above is preferred to use a catalyst capable of promoting the reaction. As concrete examples of the catalyst to be advantageously used herein, triethylamine, benzyldimethylamine, methyltriethylammonium chloride, benzyltrimethylammonium bromide, benzyltrimethylammonium iodide, triphenylphosphine, triphenylstibine, chromium octanoate, and zirconium octanoate may be cited. Preferably, the amount of such a catalyst to be used is in the range of 0.1 to 10% by weight of the reaction mixture. It is also preferable to use for the sake of preventing the reaction from inducing polymerization of the reactants a polymerization inhibitor such as, for example, hydroquinone, methyl hydroquinone, hydroquinone monomethyl ether, catechol, or pyrogallol. Preferably, the amount of such polymerization inhibitor to be used is in the range of 0.01 to 1% by weight of the reaction mixture. The temperature of the addition reaction mentioned above is preferred to be in the range of 60° to 100° C.

Properly, in the addition reaction of the aforementioned compound (c) to the carboxyl group of the aforementioned copolymer of the unsaturated carboxylic acid (a) and the unsaturated compound (b), the ratio of the former reactant to the latter reactant is adjusted such that the resultant polymer may contain one unsaturated group (the unsaturated group of the compound (c) mentioned above) per weight-average molecular weight of 400 to 4,000. If the amount of the unsaturated group introduced into the polymer exceeds the upper limit of the range of the proportion mentioned above, such phenomena as halation will occur during the formation of an image by selective exposure to light to render the formation of a sharp pattern difficult, degrade the calcination properties of a photo-cured film, and encourage the occurrence of calcining residue. Further, the excess of the unsaturated group is liable to result in embrittling the coating film and impairing the fastness of adhesion of the film to the substrate because the coating film hardens and shrinks during the radical polymerization caused by exposure to light and rigidifies excessively after the radical polymerization. Conversely, if the amount of the unsaturated group is smaller than the lower limit of the range of the proportion mentioned above, the shortage will bring an undue addition to the exposure dose required during the formation of a pattern, inflict a chip on the pattern during the steps of development and washing with water, and render the formation of a sharp pattern difficult.

Organic solvents and/or unsaturated group-containing reactive diluents are usable as the diluent (B) required to be incorporated in the photosensitive composition of the present invention.

As typical examples of the organic solvent, aromatic solvents such as toluene, xylene, tetramethylbenzene, Solvesso #100, Solvesso #150, Solvesso #200, and Exxon Aromatic Naphtha No. 2 made by Exxon Chemicals K.K., and LAWS, HAWS, VLAWS, Shelsol® D40, D70, D100, 70, 71, 72, A, AB, R, DOSB, and DOSB-8 made by Shell K.K.; aliphatic solvents such as Exxon Naphtha No. 5, No. 6, No. 7, Exxon Odorless Solvent, and Exxon Rubber Solvent made by Exxon Chemicals K.K.; alcoholic solvents such as methanol, ethanol, propanol, isopropanol, butanol, hexanol, cellosolve, butyl cellosolve, carbitol, and butyl carbitol; and ester type solvents such as ethyl acetate, butyl acetate, cellosolve acetate, carbitol acetate, methyl lactate, ethyl lactate, and butyl lactate may be cited. These organic solvents may be used either singly or in the form of a mixture of two or more members.

As typical examples of the unsaturated group-containing reactive diluent, hydroxyalkyl (meth)acrylates such as 2-hydroxyethyl (meth)acrylate and 2-hydroxypropyl (meth)acrylate; mono or di(meth)acrylates of glycol such as ethylene glycol, methoxytetraethylene glycol, and polyethylene glycol; (meth)acrylamides such as N,N-dimethyl (meth) acrylamide and N-methylol (meth)acrylamide; aminoalkyl (meth)acrylates such as N,N-dimethylaminoethyl (meth) acrylate; poly(meth)acrylates of polyhydric alcohols such as hexane diol, trimethylolpropane, pentaerythritol, ditrimethylolpropane, dipentaerythritol, and trishydroxyethyl isocyanurate or ethylene oxide adducts or propylene oxide adducts thereof; (meth)acrylates of ethylene oxide adducts or propylene oxide adducts of phenols such as phenoxyethyl (meth)acrylate and polyethoxy di(meth)acrylate of bisphenol A; (meth)acrylates of glycidyl ether such as glycerin diglycidyl ether, trimethylolpropane triglycidyl ether, and triglycidyl isocyanurate; and melamine (meth)acrylate may be cited. The reaction products of hydroxyl group-containing (meth)acrylate with polycarboxylic acid anhydride may be also cited. The reactive diluents which contain a hydroxyl group prove more favorable because they exert good influence on the stability of the compositions. These unsaturated group-containing reactive diluents may be used either singly or in the form of a mixture of two or more members. They not merely function as diluents but also promote the photo-curing properties of the composition and contribute to the improvement of the developing properties.

The organic solvents and the unsaturated group-containing reactive diluents mentioned above may be respectively either singly or in the form of a mixture of two or more members. While the diluent (B) may be incorporated in a proper amount, depending on the kind of method adopted for the application of the composition, the amount is generally proper in the range of 1 to 200 parts by weight, preferably in the range of 20 to 100 parts by weight, based on 100 parts by weight of the carboxyl group-containing photosensitive polymer (A) mentioned above.

Examples of the photopolymerization initiators (C) mentioned above include, but are not limited to: benzoin and alkyl ethers thereof such as benzoin, benzoin methyl ether, benzoin ethyl ether, and benzoin isopropyl ether; acetophenones such as acetophenone, 2,2-dimethoxy-2-phenyl acetophenone, 2,2-diethoxy-2-phenyl acetophenone, and 1,1-dichloroacetophenone; aminoacetophenones such as 2-methyl-1-[4-(methylthio)phenyl]-2-morpholinopropan-1-one and 2-benzyl-2-dimethylamino-1-(4-morpholinophenyl)-butan-1-one; anthraquinones such as 2-methylanthraquinone, 2-ethylanthraquinone, 2-t-butylanthraquinone, and 1-chloroanthraquinone; thioxanthones such as 2,4-dimethylthioxanthone, 2,4-diethylthioxanthone, 2-chlorothioxanthone, and 2,4-diisopropylthioxanthone; ketals such as acetophenone dimethyl ketal and benzyl dimethyl ketal; benzophenones such as benzophenone; or xanthones; phosphine oxides such as (2,6-dimethoxybenzoyl)-2,4,4-pentyl phosphine oxide, bis(2,4,6-trimethylbenzoyl)-phenyl phosphine oxide, 2,4,6-trimethylbenzoyl-diphenyl phosphine oxide, and ethyl-2,4,6-trimethylbenzoyl-phenyl phosphinate; and various peroxides. These well known and widely used photopolymerization initiators may be used either singly or in the form of a combination of two or more members. The ratio of incorporation of the photopolymerization initiator (C) is preferred to be in the range of 1 to 20 parts by weight, based on 100 parts by weight of the carboxyl group-containing photosensitive polymer (A).

Optionally such a photopolymerization initiator (C) may be used in combination with one or more photosensitizers such as tertiary amines like N,N-(dimethylamino)ethyl benzoate, N,N-(dimethylamino)isoamyl benzoate, pentyl-4-dimethylamino benzoate, triethylamine, and triethanolamine.

Where the photo-curing depth is required to be greater, such a titanothene type photopolymerization initiator as the product of Ciba Specialty Chemicals K.K. (sold under the product code of "CGI784") which initiates radical polymerization in a visible region and a leuco-dye may be optionally used as a curing aid in combination with the above photopolymerization initiator.

Fine metal particles (D-1) or mixtures of such fine metal particles with fine glass particles (D-2) may be cited as concrete examples of the inorganic particles (D) to be used in formulating the photosensitive composition of the present invention as an electroconductive paste.

Examples of the fine metal particles (D-1) include gold, silver, copper, palladium, platinum, aluminum, nickel, and alloys thereof, for example. The metal powders mentioned above may be used either singly or in the form of a combination of two or more members. From the viewpoint of resolution, the metal powder is preferred to have an average particle diameter of not more than 10 microns. These metal powders in the form of spheres, blocks, flakes, and dendrites may be used either singly or in the form of a combination of two or more members.

Properly, the amount of the metal powder to be incorporated is in the range of 25 to 1,000 parts by weight, based on 100 parts by weight of the aforementioned carboxyl group-containing photosensitive polymer (A). If the amount of the metal powder to be incorporated is less than 25 parts by weight, the shortage will tend to cause contraction of line width of the conductor circuit or breakage of the line. Conversely, if the amount exceeds 1,000 parts by weight, the excess will impair the permeation of light and render the impartation of sufficient photo-curing properties to the composition difficult.

For the purpose of enabling the film formed after calcining to acquire enhanced strength and exhibit improved fastness of adhesion to the substrate, a glass powder (D-2) which will be specifically described hereinbelow may be additionally incorporated in an amount in the range of 1 to 30 parts by weight, based on 100 parts by weight of the metal powder.

A low melting glass having a softening point in the range of 300° to 600° C. is used as the glass powder (D-2) which is needed when the photosensitive composition of the present invention is formulated as glass paste. The species of low melting glass which use lead oxide, bismuth oxide, or zinc oxide as a main component and have an average particle diameter of not more than 10 microns are advantageously adopted herein.

Properly, the amount of the glass powder to be incorporated is in the range of 50 to 2,000 parts by weight, based on 100 parts by weight as the total amount of the carboxyl group-containing photosensitive polymer (A), the diluent (B), and the photo-polymerization initiator (C).

One preferable example of the glass powder containing lead oxide as the main component thereof is an amorphous frit which is composed of (in percent by weight of oxide basis) 48–82% of $PbO$, 0.5–22% of $B_2O_3$, 3–32% of $SiO_2$, 0–12% of $Al_2O_3$, 0–10% of $BaO$, 0–15% of $ZnO$, 0–2.5% of $TiO_2$, and 0–25% of $Bi_2O_3$ and has a softening point in the range of 420–590° C.

One preferable example of the glass powder containing bismuth oxide as the main component thereof is an amorphous frit which is composed of (in percent by weight of oxide basis) 35–88% of $Bi_2O_3$, 5–30% of $B_2O_3$, 0–20% of $SiO_2$, 0–5% of $Al_2O_3$, 1–25% of $BaO$, and 1–20% of $ZnO$ and has a softening point in the range of 420–590° C.

One preferable example of the glass powder containing zinc oxide is an amorphous frit which is composed of (in percent by weight of oxide basis) 25–60% of $ZnO$, 2–15% of $K_2O$, 25–45% of $B_2O_3$, 1–7% of $SiO_2$, 0–10% of $Al_2O_3$, 0–20% of $BaO$, and 0–10% of $MgO$ and has a softening point in the range of 420–590° C.

Where the paste requires to have a black color tone, a black pigment which is formed of a metal oxide containing as a main component thereof one or more members selected from among Fe, Co, Cu, Cr, Mn, and Al may be additionally incorporated.

As the inorganic powder (D-3) which is used when the photosensitive composition of the present invention is formulated as fluorescent paste, various fluorescent powder may be used, depending on the purpose of application. For example, a long-afterglow fluorescent substance possessed of a sort of ceramic structure and obtained by mixing the oxide of at least one metallic element selected from the elements belonging to Groups IIa, IIIa, and IIIb in the Periodic Table of the Elements such as, for example, calcium oxide, strontium oxide, barium oxide, alumina, or cerium oxide with at least one rare earth element selected from among Sc, Y, La, Ce, Pr, Nd, Sm, Eu, Gd, Tb, Dy, Ho, Er, Tm, Yb, and Lu as an activating agent or coactivating agent and sintering the resultant mixture and a fluorescent substance formed of a sulfide of zinc or an alkali earth as a typical phosphorescent material may be used. Generally, $(Y,Gd)BO_3$:Eu (borates of yttrium and gadolinium having europium as a fluorescent center; emitting a red color), $Zn_2SiO_4$:Mn (zinc silicate having manganese as a fluorescent center, emitting a green color), $BaO.6Al_2O_3$:Mn (emitting a green color), $BaMgAl_{14}O_{23}$:Eu (barium magnesium aluminate having europium as a fluorescent center, emitting a blue color), and $BaMgA_{10}O_{17}$:Eu (emitting a blue color) are used for the fluorescent layer of a plasma display panel. Properly, such a fluorescent powder has an average particle diameter of not more than 10 microns, preferably not more than 5 microns. The amount of the fluorescent powder to be incorporated is the same as the metal powder mentioned above.

Since the inorganic powder having an average particle diameter of not more than 10 microns is advantageously used in the present invention, it is preferred for the purpose of preventing secondary agglomeration and improving dispersibility in the composition to have undergone a preliminary surface treatment with an organic acid, an inorganic acid, a silane coupling agent, a titanate-based coupling agent, or an aluminum-based coupling agent to an extent not so large as to impair the quality of the inorganic powder or to have incorporated therein the treating agent mentioned above at the time the photosensitive composition is converted into a paste. The method for treating the inorganic powder is preferred to comprise the steps of dissolving such a surface-treating agent as mentioned above in an organic solvent or water, stirring the resultant solution with the inorganic powder added thereto, distilling the produced blend thereby expelling the solvent by distillation, and heat-treating the residue of the distillation at a temperature in the approximate range of 50 to 200° C. for a period of not less than two hours.

The photosensitive composition according to the present invention, for the purpose of improving the storage stability of the composition, incorporates therein a compound which is capable of forming a complex or a salt in conjunction with a metal or oxide powder, as the stabilizer (E).

Such acids as inorganic acids, organic acids, and phosphoric acid compounds (inorganic phosphoric acid and organic phosphoric acid) can be advantageously used as the stabilizer (E). Such a stabilizer is preferred to be incorporated in an amount in the range of 0.1 to 5 parts by weight, based on 100 parts by weight of the inorganic powder (D).

As concrete examples of the inorganic acid, nitric acid, sulfuric acid, hydrochloric acid, and boric acid may be cited.

As concrete examples of the organic acid, formic acid, acetic acid, acetoacetic acid, citric acid, isocitric acid, anisic acid, propionic acid, butyric acid, isobutyric acid, valeric acid, isovaleric acid, azelaic acid, caproic acid, isocaproic acid, enanthic acid, caprylic acid, pelargonic acid, undecanoic acid, laurylic acid, tridecanoic acid, myristic acid, palmitic acid, stearic acid, arachic acid, behenic acid, oxalic acid, malonic acid, ethylmalonic acid, succinic acid, glutaric acid, adipic acid, pimelic acid, pyruvic acid, piperonic acid, pyromellitic acid, suberic acid, azelaic acid, sebacic acid, maleic acid, fumaric acid, phthalic acid, isophthalic acid, terephthalic acid, tartaric acid, levulinic acid, lactic acid, benzoic acid, isopropylbenzoic acid, salicylic acid, isocaproic acid, crotonic acid, isocrotonic acid, acrylic acid, methacrylic acid, tiglic acid, ethylacrylic acid, ethylidene propionic acid, dimethylacrylic acid, citronellic acid, undeceneic acid, undecanoic acid, oleic acid, elaidic acid, erucic acid, brassidic acid, phenylacetic acid, cinnamic acid, methylcinnamic acid, naphthoeic acid, abietic acid, acetylene dicarboxylic acid, atrolactinic acid, itaconic acid, crotonic acid, sorbic acid, vanillic acid, palmitic acid, hydroxycinnamic acid, hydroxynaphtheic acid, hydroxybutyric acid, biphenyl dicarboxylic acid, phenylcinnamic acid, phenylacetic acid, phenylpropionic acid, phenoxyacetic acid, propionic acid, hexanic acid, heptanoic acid, veratric acid, benzilic acid, oxalosuccinic acid, oxaloacetic acid, octanoic acid, gallic acid, mandellic acid, messaconic acid, methylmaroic acid, mellitic acid, lauric acid, ricinoleic acid, linoleic acid, and malic acid may be cited.

As concrete examples of the inorganic phosphoric acid, phosphoric acid, phosphorous acid, hypophosphorous acid, orthophosphoric acid, diphoshoric acid, tripolyphospshoric acid, and phosphonic acid may be cited.

As concrete examples of the organic phosphoric acid, methyl phosphate, ethyl phosphate, propyl phosphate, butyl phosphate, phenyl phosphate, dimethyl phosphate, diethyl phosphate, dibutyl phosphate, dipropyl phosphate, diphenyl phosphate, isopropyl phosphate, diisopropyl phosphate, n-butyl phosphate, methyl phosphite, ethyl phosphite, propyl phosphite, butyl phosphite, phenyl phosphate, dimethyl phosphite, diethyl phosphate, dibutyl phosphite, dipropyl phosphite, diphenyl phosphite, isopropyl phosphate, diisopropyl phosphite, n-butyl-2-ethylhexyl phosphite, hydroxyethylene diphosphonic acid, adenosine triphosphoric acid, adenosin phosphoric acid, mono(2-methacryloyloxyethyl) acid phosphate, mono(2-acryloyloxyethyl) acid phosphate, di(2-methacryloyloxyethyl) acid phosphate, di(2-acryloyloxyethyl) acid phosphate, ethyldiethylphosphonoacetate, ethyl acid phosphate, butyl acid phosphate, butylpyrophosphate, butoxyethyl acid phosphate, 2-ethylhexyl acid phosphate, oleyl acid phosphate, tetracosyl acid phosphate, diethylene glycol acid phosphate, and (2-hydroxyethyl)methacrylate acid phosphate may be cited.

As other acids, such sulfonic acids as benzenesulfonic acid, toluenesulfonic acid, naphthalenesulfonic acid, ethane sulfonic acid, naphtholsulfonic acid, taurine, methanillic acid, sulfanilic acid, naphthylaminesulfonic acid, sulfobenzoic acid, and sulfamic acid are also usable.

The stabilizers enumerated above may be used either singly or in the form of a combination of two or more members.

The photosensitive composition of the present invention may further incorporate therein, as occasion demands, such other additives as various pigments, particularly heat-resistant inorganic pigments, and silicone-based or acrylic anti-foaming agents and leveling agents in an amount incapable of impairing the desired properties of the composition. It may also incorporate therein, as occasion demands, a known and popularly used antioxidant for preventing the electroconductive metal powder from oxidation, a thermal polymerization inhibitor for improving the thermal stability during storage, and fine particles of metallic oxide, silicon oxide, or boric oxide as a binding component with the substrate during the calcining work.

The photosensitive composition of the present invention can be used in the form of electroconductive paste, glass paste, or fluorescent paste as described above. It may be otherwise used in the form of a film. When the paste is used in its unmodified form, it is applied to a varying substrate of glass sheet or ceramic sheet by a suitable method such as screen printing method, curtain coating method, roll coating method, bar coating method, or blade coating method. The applied layer of the paste is then dried with a hot air circulation type drying oven or a far infrared drying oven at a temperature in the approximate range of 60° to 120° C. for a period in the approximate range of 5 to 40 minutes, for example, to produce a tack-free coating film. Then, this film is subjected to selective exposure to light, development, and calcining to give rise to a conductor pattern, a vitreous dielectric pattern, or a fluorescent pattern as requested.

Figure 2A:
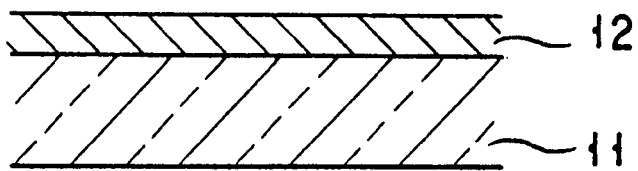
FIGS. 2A through 2D are fragmentary sectional side views for an explanation of process flow illustrating one embodiment of the method of the present invention.
Figure 2B:
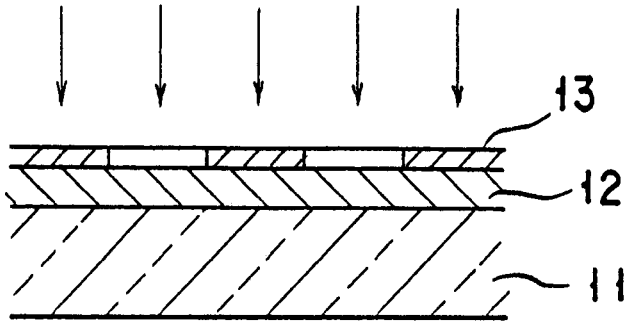
Figure 2C:
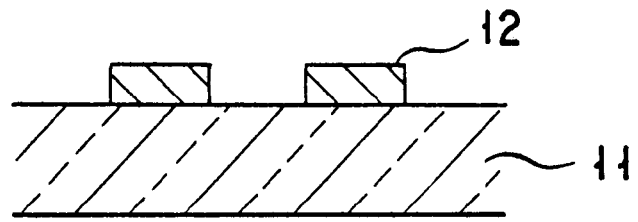
Figure 2D:
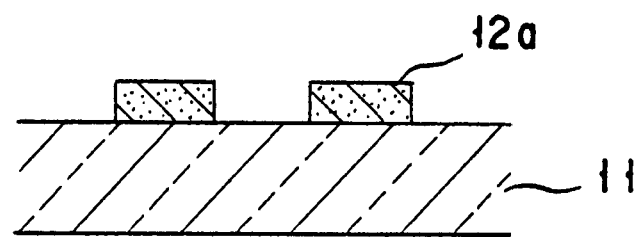

FIGS. 2A through 2D represent the mode using a photosensitive paste for the production of a calcined film. First, the photosensitive paste (conductive paste or insulating paste) is applied on such a transparent substrate 11 as glass substrate as illustrated in FIG. 2A and the applied layer of the paste is dried to produce a film 12 exhibiting good tack-free touch of finger. A photomask 13 containing a prescribed mask pattern is superposed on the film 12 and the film 12 is selectively exposed to light through the photomask 13 (FIG. 2B). After the removal of the photomask 13, the exposed film 12 is developed to remove the unexposed portions and assume the prescribed pattern (FIG. 2C). In this case, an aqueous alkaline solution, for example, is used as the developing solution. Thereafter, the patterned film 12 is treated at a prescribed temperature, depending on the photosensitive paste used herein, to effect removal of the binder and calcination and consequently form on the substrate 11 a patterned calcined film 12a (electro-conducting film or insulating film) of the inorganic material as illustrated in FIG. 2D.

The step of exposure can be accomplished by using a photo-mask containing a prescribed exposure pattern which is in contact with the dried layer (contact exposure) or out of contact with that layer (noncontact exposure). In terms of resolution, the contact exposure is preferred to the noncontact exposure. The light sources which are usable for the exposure include a halogen lamp, a high-pressure mercury-vapor lamp, a laser beam, a metal halide lamp, a black lamp, and an electrodeless discharge lamp, for example. A preferred irradiation dose is in the approximate rage of 50 to 1,000 mJ/cm$^2$.

For the step of development, the spray method or the immersion method is used. As a developing solution, the aqueous solutions of such alkali metals as sodium hydroxide, potassium hydroxide, sodium carbonate, potassium carbonate, and sodium silicate and the aqueous solutions of amines such as monoethanolamine, diethanolamine, and triethanolamine can be used advantageously. A particularly advantageous developing solution is a dilute alkaline aqueous solution having a concentration not more than about 1.5% by weight. The developing solution is only required to saponify the carboxyl groups of the carboxyl group-containing photosensitive polymer (A) in the composition and permit removal of the uncured areas (unexposed areas) and, therefore, is not required to be limited to those examples cited above. After the step of development, the developed layer is preferred to be washed with water or neutralized with an acid for the removal of the unwanted residual developing solution.

At the calcining step, the substrate which has undergone the development is heat-treated in the air or an atmosphere of nitrogen at a temperature in the approximate range of 380° to 600° C. to give a required pattern such as the conductor pattern, vitreous dielectric pattern, and fluorescent pattern. At this time, the step of calcining is preferred to be preceded by a step of heating the substrate to a temperature in the approximate range of 300° to 500° C. and keeping it at this temperature for a prescribed period thereby depriving the substrate of organic substances.

As described above, the alkali-developing type photosensitive composition of the present invention enjoys a large photo-curing depth during the course of exposure to light and consequently permits a calcined pattern of high fineness to be stably formed without entailing such problems as distortion of patterns and contraction of line width after the step of calcining. Further, owing to the excellence in photo-curing properties and resolution, this composition permits formation of a pattern of high fineness even when the film has a relatively large thickness and, for a fixed thickness of film, allows the exposure dose necessary for the formation of a fixed line/space pattern to be minimized and, therefore, proves advantageous from the viewpoint of energy-saving.

Now, the present invention will be described specifically below by reference to working examples and comparative examples. Wherever "parts" and "%" are mentioned, they invariably mean "parts by weight" and "% by weight" unless otherwise specified.

SYNTHETIC EXAMPLE 1

Into a three-necked flask equipped with a thermometer, a stirrer, a dropping funnel, and a reflux condenser, 200 g of methyl methacrylate, 86 g of methacrylic acid, and 300 g of diethylene glycol monoethyl ether acetate were charged and azobisisobutyronitrile was added thereto as a catalyst. They were stirred and left reacting at 80° C. for 15 hours. Thereafter, 56 g of α-methylglycidyl methacrylate, 0.5 g of triphenylphosphine, and 0.2 g of hydroquinone as a polymerization inhibitor were weighed out, added into the above reaction solution dropwise through the dropping funnel and left reacting in the flask at 80° C. for 8 hours to obtain a carboxyl group-containing photosensitive polymer (A-1). The acid value of the resultant resin was 93.1 mg KOH/g.

SYNTHETIC EXAMPLE 2

Into a three-necked flask equipped with a thermometer, a stirrer, a dropping funnel, and a reflux condenser, 200 g of methyl methacrylate, 86 g of methacrylic acid, and 300 g of diethylene glycol monoethyl ether acetate were charged and azobisisobutyronitrile was added thereto as a catalyst. They were stirred and left reacting at 80° C. for 15 hours. Thereafter, 56 g of α-methylglycidyl methacrylate, 10 g of Cyclomer M101 (a compound having $CH_2O[CO(CH_2)_5]$ for $R^3$ and $CH_3$ for $R^4$ in the aforementioned formula (2), made by Daicel Ltd.), 0.5 g of triphenylphosphine, and 0.2 g of hydroquinone as a polymerization inhibitor were weighed out, added into the above reaction solution dropwise through the dropping funnel and left reacting in the flask at 80° C. for 8 hours to obtain a carboxyl group-containing photosensitive polymer (A-2). The acid value of the resultant resin was 95 mg KOH/g.

SYNTHETIC EXAMPLE 3

Into a three-necked flask equipped with a thermometer, a stirrer, a dropping funnel, and a reflux condenser, 284 g of t-butyl methacrylate, 172 g of methacrylic acid, and 300 g of diethylene glycol monoethyl ether acetate were charged and azobisisobutyronitrile was added thereto as a catalyst. They were stirred and left reacting at 80° C. for 15 hours. Thereafter, 137 g of Cyclomer M100 (a compound having $CH_2$ for $R^3$ and $CH_3$ for $R^4$ in the aforementioned formula (2), made by Daicel Ltd.), 0.5 g of triphenylphosphine, and 0.2 g of hydroquinone as a polymerization inhibitor were weighed out, added into the above reaction solution dropwise through the dropping funnel and left reacting in the flask at 80° C. for 8 hours to obtain a carboxyl group-containing photosensitive polymer (A-3). The acid value of the resultant resin was 110 mg KOH/g.

COMPARATIVE SYNTHETIC EXAMPLE 1

In a three-necked flask equipped with a thermometer, a stirrer, a dropping funnel, and a reflux condenser, 250 g of methyl methacrylate, 43 g of methacrylic acid, and 300 g of diethylene glycol monoethyl ether acetate were placed and azobisisobutyronitrile was added thereto as a catalyst. They were stirred and heated at 80° C. and left reacting for 10 hours to obtain a carboxyl group-containing polymer (A'). The acid value of the resultant resin was 110 mg KOH/g.

EXAMPLES 1–6 AND COMPARATIVE EXAMPLES 1 AND 2

The resins obtained in the synthetic examples mentioned above and other components were compounded at the compositions shown in the Table below. They were stirred with a stirrer and kneaded with a three-roll mill till a pasty constitution to produce photosensitive compositions.

Test for Properties:

The photosensitive compositions produced in the form of paste as described above were each applied in a thickness of 40 microns on a glass substrate by the use of a 200-mesh stainless screen. The applied film was dried in a hot air drying oven at 80° C. for 20 minutes. The dry film, with a negative film of a line/space pattern of L/S=30/150 (microns) attached fast thereto, was exposed to the ultraviolet light by means of an exposure device (made by Orc K.K., Model "680 GW"), then developed with an aqueous 1% $Na_2CO_3$ solution of 30° C. under a water pressure of 1.5 $kgf/cm^2$ for one minute, washed with water, and dried. The dried film was subsequently calcined in a calcination furnace at 450° C. for 30 minutes, further heated to 550° C., and calcined at that temperature for 30 minutes to manufacture a sample substrate. This sample was rated for the following items.

Stability of Storage:

The stability of storage was rated by keeping a given paste at 20° C. for three days, one month or three months. At the end of each of the standing periods, the paste was measured for increase of viscosity and rated on the following three-point scale.

○: Less than 15% of increase of viscosity
  Δ: 15% to 30% of increase of viscosity
  X: Not less than 30% of increase of viscosity Resolution:

The exposure to the ultraviolet light was performed by using a negative film having a line width of 30 μm and a space of 150 μm at 200 mJ/cm².

The resolution was determined by visually observing a given sample with respect to reproducibility of line width, shape of line, and presence or absence of line breakage through an optical microscope and was rated on the following three-point scale.

○: Highly satisfactory in all the respects
  Δ: A difference of not less than ±10 μm was discernible in the reproducibility of line width, irregularity of shape was clear, and no line breakage was observed.
  X: A difference of not less than ±15 μm was discernible in the reproducibility of line width, irregularity of shape was clear, and line breakage was observed.

Shape of Calcined Line:

The shape of calcined line was determined by heating the sample substrate to 450° C. at a temperature increasing rate of 5° C./minute, holding the sample substrate at 450° C. for 30 minutes, calcining it to expel organic substances, again heating it at a temperature increasing rate of 5° C./minute, calcining it at 550° C. for 30 minutes, and visually observing the calcined sample substrate through an optical microscope, with the rating performed on the following two-point scale.

Good: The shape before calcination was retained intact.
  Poor: The shape before calcination was not retained and the lines sustained breakage and distortion.

Specific Resistance:

The specific resistance was determined by measuring a pattern, 0.4 cm×10 cm, on a given sample for magnitude of resistance and thickness of film and performing a calculation using the results of the measurement.

The results of rating of various properties mentioned above are shown in the following Table.

TABLE

| Composition (parts by weight) and properties | | Examples | | | | | | Comparative Examples | |
|---|---|---|---|---|---|---|---|---|---|
| | | 1 | 2 | 3 | 4 | 5 | 6 | 1 | 2 |
| Photosensitive resin | A-1 | 188 | 188 | — | — | — | — | — | — |
| | A-2 | — | — | 185 | 185 | — | — | — | — |
| | A-3 | — | — | — | — | 151 | 151 | — | — |
| | A' | — | — | — | — | — | — | 202 | 202 |
| Silver powder[*1] | | — | 450 | — | 450 | — | 450 | — | 450 |
| Glass frit[*2] | | 650 | 20 | 650 | 20 | 650 | 20 | 650 | 20 |
| Photopolyserization initiator[*3] | | 10 | 10 | 10 | 10 | 10 | 10 | 10 | 10 |
| Diluent[*4] | | 55 | 55 | 55 | 55 | 55 | 55 | 55 | 55 |
| Anti-foaming agent[*5] | | 3 | 3 | 3 | 3 | 3 | 3 | 3 | 3 |
| Stabilizer[*6] | | 1.5 | 1.5 | 1.5 | 1.5 | 1.5 | 1.5 | 1.5 | 1.5 |
| Stability of storage | After three days | ○ | ○ | ○ | ○ | ○ | ○ | ○ | ○ |

TABLE-continued

| Composition (parts by weight) and properties | Examples | | | | | | Comparative Examples | |
|---|---|---|---|---|---|---|---|---|
| | 1 | 2 | 3 | 4 | 5 | 6 | 1 | 2 |
| After one month | ○ | ○ | ○ | ○ | ○ | ○ | Δ | ○ |
| After three months | Δ | ○ | Δ | ○ | Δ | ○ | x | x |
| Resolution (exposed dose 200 mJ/cm$^2$) | ○ | ○ | ○ | ○ | ○ | Δ | Δ | x |
| Shape of calcined lines | good | good | good | good | good | good | good | poor |
| Specific resistance ($\times 10^{-6}$ Ω · cm) | — | 4.0 | — | 3.8 | — | 3.6 | — | 5.2 |

Remarks
*[1]Silver powder having an average particle diameter of 1 μm, which had been treated with a fatty acid. (The treatment with the fatty acid was performed by placing 400 wt. % of a given silver powder in a solution of 1 wt. % of linolic acid in a 1:1 mixed solution of water : isopropanol, stirring them together, distilling the resultant mixture thereby expelling the solvent by evaporation, and heating the residue at 70° C. for three hours.)
*[2]Amorphous frit-having a composition of 70% of PbO, 1.5% of $B_2O_2$, 23% of $SiO_2$, 1.5% of $Al_2O_3$, and 4% of BaO and a softening point of 522 ° C.; which had been pulverized to exhibit an average particle diameter of 2.0 μm.
*[3]2-Methyl-1-[4-(methylthio)phenyl]-2-morpholinoamino-propan-1-one
*[4]Pentaerythritol triacrylate
*[5]Silicon-based anti-foaming agent manufactured by Shin-etsu Chemical Co., Ltd. and sold under the product code of "K566".
*[6]Malonic acid While certain specific working examples have been disclosed herein, the invention may be embodied in other specific forms without departing from the spirit or essential characteristics thereof. The described examples are therefore to be considered in all respects as illustrative and not restrictive, the scope of the invention being indicated by the appended claims rather than by the foregoing description and all changes which come within the meaning and range of equivalency of the claims are, therefore, intended to be embraced therein.

What is claimed is:

1. A photosensitive composition, comprising in combination:

(A) a carboxyl group-containing photosensitive polymer obtained by the reaction of a copolymer of (a) a compound containing an unsaturated double bond and a carboxyl group and (b) an unsaturated double bond-containing compound with (c) a compound containing an unsaturated double bond and an epoxy group, said compound (c) being selected from the group consisting of compounds represented by the following formulas (1) and (2):

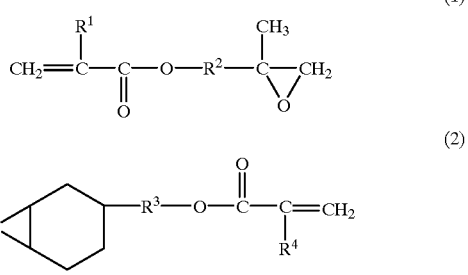

wherein, $R^1$ and $R^4$ independently represent a hydrogen atom or a methyl group, $R^2$ represents an aliphatic hydrocarbon of 1 to 12 carbon atoms, and $R^3$ represents —$CH_2$—  or  —$CH_2$—O—$\overset{\overset{O}{\|}}{C}$—$(CH_2)_5$$\overline{]_n}$—, where n is a positive integer, (B) a diluent,
(C) a photopolymerization initiator,
(D) an inorganic powder, and
(E) a stabilizer, said stabilizer being at least one acid selected from the group consisting of inorganic acids, inorganic phosphoric acids, and organic phosphoric acids.

2. The composition according to claim 1, wherein said carboxyl group-containing photosensitive polymer (A) is present in an amount of 5 to 30% by weight of the total amount of the composition.

3. The composition according to claim 1, wherein said carboxyl group-containing photosensitive polymer (A) has a weight-average molecular weight in the range of 500 to 50,000 and contains one unsaturated group per weight-average molecular weight of 400 to 4,000.

4. The composition according to claim 1, wherein said compound (a) containing an unsaturated double bond and a carboxyl group is selected from the group consisting of acrylic acid, methacrylic acid, itaconic acid, crotonic acid, maleic acid, fumaric acid, vinylacetic acid, and anhydrides of these acids; and a reaction product of an acid anhydride with a hydroxyalkyl (meth)acrylate.

5. The composition according to claim 1, wherein said unsaturated double bond-containing compound (b) is selected from the group consisting of styrene, chlorostyrene, α-methylstyrene, alkyl (meth)acrylates, mono(meth) acrylates of polyethylene glycol, mono(meth)acrylates of polypropylene glycol, vinyl acetate, vinyl butyrate, vinyl benzoate, acrylamide, methacrylamide, N-hydroxymethyl acrylamide, N-hydroxymethyl methacrylamide, N-methoxymethyl acrylamide, N-ethoxymethyl acrylamide, N-butoxymethyl acrylamide, acrylonitrile, vinyl ethers, and isobutylene.

6. The composition according to claim 1, wherein said unsaturated double bond-containing compound (b) is selected from the group consisting of styrene, α-methylstyrene, alkyl (meth)acrylate, and isobutylene.

7. The composition according to claim 1, wherein said diluent (B) is selected from the group consisting of an organic solvent and a photopolymerizable monomer having an unsaturated group and present in an amount of 1 to 200 parts by weight, based on 100 parts by weight of said carboxyl group-containing photosensitive polymer (A).

8. The composition according to claim 1, wherein said photopolymerization initiator (C) is present in an amount of 1 to 20 parts by weight, based on 100 parts by weight of said carboxyl group-containing photosensitive polymer (A).

9. The composition according to claim 1, wherein said inorganic powder (D) is at least one member selected from the group consisting of fine metal powder, glass powder, and black pigment.

10. The composition according to claim 9, wherein said fine metal powder has an average particle diameter of not more than 10 microns and is present in an amount of 25 to 1,000 parts by weight, based on 100 parts by weight of said carboxyl group-containing photosensitive polymer (A).

11. The composition according to claim 9, wherein said glass powder has an average particle diameter of not more than 10 microns and a softening point of 300° to 600° C. and is present in an amount of 50 to 2,000 parts by weight, based on 100 parts by weight of the total of said carboxyl group-containing photosensitive polymer (A), said diluent (B) and said photopolymerization initiator (C).

12. The composition according to claim 1, wherein said stabilizer (E) is present in an amount of 0.1 to 5 parts by weight, based on 100 parts by weight of said inorganic powder (D).

13. The composition according to claim 1, which is in the form of paste.

14. The composition according to claim 1, which is formed in the form of film.

15. A calcined pattern obtained by placing fast on a substrate a film of a photosensitive composition set forth in claim 1, patterning said film, and calcining the patterned film.

16. A photosensitive composition, comprising in combination:

(A) a carboxyl group-containing photosensitive polymer obtained by the reaction of a copolymer of (a) a compound containing an unsaturated double bond and a carboxyl group and (b) an unsaturated double bond-containing compound with (c) a compound containing an unsaturated double bond and an epoxy group, said compound (c) being selected from the group consisting of compound (c) being selected from the group consisting of compounds represented by the following formulas (3) and (4):

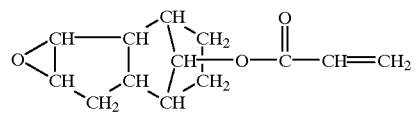

(3)

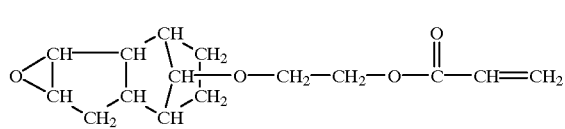

(4)

(B) a diluent, (C) a photopolymerization initiator, (D) an inorganic powder, and (E) a stabilizer, said stabilizer being at least one acid selected from the group consisting of inorganic acids, inorganic phosphoric acids, and organic phosphoric acids.

* * * * *